United States Patent
Zhao et al.

(10) Patent No.: US 10,840,477 B2
(45) Date of Patent: Nov. 17, 2020

(54) OLED DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Zhenyu Zhao, Wuhan (CN); Hui Li, Wuhan (CN); Mang Huang, Wuhan (CN)

( * ) Notice: Subject to any disclaimer, the term of this patent is extended or adjusted under 35 U.S.C. 154(b) by 0 days.

(21) Appl. No.: 16/315,638

(22) PCT Filed: Dec. 12, 2018

(86) PCT No.: PCT/CN2018/120736
§ 371 (c)(1),
(2) Date: Jan. 6, 2019

(87) PCT Pub. No.: WO2020/056941
PCT Pub. Date: Mar. 26, 2020

(65) Prior Publication Data
US 2020/0099007 A1    Mar. 26, 2020

(30) Foreign Application Priority Data
Sep. 20, 2018 (CN) .......................... 2018 1 1099040

(51) Int. Cl.
*H01L 51/52* (2006.01)
*H01L 51/00* (2006.01)
(Continued)

(52) U.S. Cl.
CPC ...... *H01L 51/5253* (2013.01); *H01L 27/3244* (2013.01); *H01L 27/3246* (2013.01);
(Continued)

(58) Field of Classification Search
CPC ............. H01L 27/3241; H01L 27/3244; H01L 27/3246; H01L 27/3281; H01L 27/3283; H01L 33/54; H01L 33/56; H01L 51/0005; H01L 51/0097; H01L 51/524; H01L 51/5253
See application file for complete search history.

(56) References Cited

U.S. PATENT DOCUMENTS

| 10,224,383 B2 * | 3/2019 | Park .................. H01L 51/5237 |
| 2018/0061728 A1 * | 3/2018 | Chen ................. H01L 51/5246 |

(Continued)

FOREIGN PATENT DOCUMENTS

| CN | 105610710 A | 7/2016 |
| CN | 106816456 A | 6/2017 |

(Continued)

*Primary Examiner* — Stephen W Smoot

(57) ABSTRACT

An organic light emitting diode (OLED) display device includes a flexible substrate, a thin-film transistor (TFT) layer, an OLED light emitting layer, a barrier layer, and an encapsulation layer. The encapsulation layer covers the barrier layer, and a portion of the encapsulation layer located at an outside of the barrier layer includes a first inorganic layer and a second inorganic layer. A protection layer is disposed on a portion of the first inorganic layer over surface the barrier layer, and the protection layer completely covers the barrier layer.

13 Claims, 1 Drawing Sheet

(51) Int. Cl.
*H01L 27/32* (2006.01)
*H01L 33/54* (2010.01)

(52) U.S. Cl.
CPC ...... *H01L 27/3258* (2013.01); *H01L 27/3283* (2013.01); *H01L 33/54* (2013.01); *H01L 51/0005* (2013.01); *H01L 51/0097* (2013.01); *H01L 51/524* (2013.01)

(56) References Cited

U.S. PATENT DOCUMENTS

| | | | | |
|---|---|---|---|---|
| 2018/0337365 | A1* | 11/2018 | Harada | H01L 51/5253 |
| 2018/0342700 | A1* | 11/2018 | Cai | H01L 51/5253 |
| 2019/0058025 | A1 | 2/2019 | Huang | |
| 2019/0058156 | A1 | 2/2019 | Sun et al. | |
| 2019/0165080 | A1* | 5/2019 | Ito | H01L 51/5203 |
| 2019/0326513 | A1* | 10/2019 | Suga | H05B 33/10 |
| 2020/0020880 | A1* | 1/2020 | Saida | H05B 33/04 |

FOREIGN PATENT DOCUMENTS

| | | | |
|---|---|---|---|
| CN | 107482042 | A | 12/2017 |
| CN | 107528010 | A | 12/2017 |

\* cited by examiner ic light emitting diode (OLED)
OLED DISPLAY DEVICE

BACKGROUND OF INVENTION

1. Field of Invention

The present invention relates to a field of display, and more particularly to an organic light emitting diode (OLED) display device.

2. Related Art

Organic light emitting diode (OLED) devices are widely used in the field of mobile phone screen or computer display because of the advantages of being self-luminous, quick response, low driving voltage, high resolution, rich colors, and high light emitting efficiency.

The major problem about development of OLED devices is that the lifespan of the OLED devices is too short, because an electrode layer and a light emitting layer for constituting the OLED devices are very sensitive to moisture and oxygen in the air. In the event that the electrode layer and the light emitting layer are eroded by moisture or oxygen, performance of the OLED devices is adversely affected. Current thin-film encapsulation is generally configured with a sandwich structure, multi-organic layers and multi-inorganic layers laminated with each other, taking advantages of blocking properties of the inorganic layers and stress-resistant properties of the organic layers for encapsulation. As a result, a barrier layer is necessitated to limit a film forming range of an organic layer formed by ink jet printing, so as to allow the inorganic layer to completely cover the organic layer, thereby preventing moisture or oxygen from entering an OLED device through the organic layer having poor blocking properties. However, due to liquid properties of an organic ink material, a risk exists that an organic material may overflow a barrier layer to exceed coverage of an inorganic layer, whereby permeation of moisture or oxygen from the outside along the overextended organic layer in the OLED device may happen, resulting in a failure of the OLED device.

Regarding current OLED display devices, a too large amount of ink jet is applied through an ink jet printing technique for preparing an organic layer during a process of thin-film encapsulation. As a result, organic ink is diffused to overflow a barrier layer, causing portions of the organic ink at an inside and outside of the barrier layer to communicate with each other, and thus the organic layer exceeds coverage of the inorganic layer. This further brings about permeation of moisture or oxygen from the outside into the OLED display devices, resulting in ineffectiveness of the OLED display devices.

SUMMARY OF INVENTION

Accordingly, an object of the present invention is to provide an organic light emitting diode (OLED) display device capable of separating an organic layer at an inside of a barrier layer from an overflowing portion of the organic layer to over technical problems of current OLED display devices that an amount of ink jet is too much causing an organic ink to be diffused over a barrier layer, and the organic ink at an inside and outside of the barrier layer to be interconnected, and thus an organic layer is formed in excess of coverage of an inorganic layer, further bringing about permeation of moisture or oxygen from the outside and resulting in ineffectiveness of the OLED display devices.

To achieve the above-mentioned object, the OLED display device of the present invention includes a flexible substrate; a thin-film transistor (TFT) layer disposed on the flexible substrate; an OLED light emitting layer disposed on the TFT layer; a barrier layer disposed on the TFT layer; and an encapsulation layer covering the barrier layer, and a portion of the encapsulation layer located at an outside of the barrier layer comprising a first inorganic layer and a second inorganic layer; wherein a protection layer is disposed on a portion of the first inorganic layer over a surface of the barrier layer, the protection layer completely covers the barrier layer, and the protection layer has a hydrophobicity greater than a hydrophobicity of the first inorganic layer.

In the OLED display device in accordance with the embodiment of the present invention, the protection layer is made of monocrystalline silicon.

In the OLED display device in accordance with the embodiment of the present invention, the second inorganic layer is made of a material same as that of the first inorganic layer.

In the OLED display device in accordance with the embodiment of the present invention, a portion of the encapsulation layer located at an inside of the barrier layer comprises the first inorganic layer, an organic layer, and the second inorganic layer.

In the OLED display device in accordance with the embodiment of the present invention, the organic layer has a thickness greater than that of the first inorganic layer, and the second inorganic layer has a thickness same as that of the first inorganic layer.

In the OLED display device in accordance with the embodiment of the present invention, the barrier layer has a thickness less than that of the organic layer, and the thickness of the barrier layer is greater than that of the first inorganic layer.

In the OLED display device in accordance with the embodiment of the present invention, the organic layer is formed on the first inorganic layer through an ink jet printing process.

In the OLED display device in accordance with the embodiment of the present invention, the ink jet printing process is performed with an organic ink consisting of acid ester organic matter, acid organic matter, and photopolymerization initiator.

The present invention further provides an organic light emitting diode (OLED) display device, including flexible substrate; a thin-film transistor (TFT) layer disposed on the flexible substrate; an OLED light emitting layer disposed on the TFT layer; a barrier layer disposed on the TFT layer; and an encapsulation layer covering the barrier layer, and a portion of the encapsulation layer located at an outside of the barrier layer comprising a first inorganic layer and a second inorganic layer; wherein a protection layer is disposed on a portion of the first inorganic layer over a surface of the barrier layer, the protection layer completely covers the barrier layer, and the protection layer completely covers the barrier layer.

In the OLED display device in accordance with the embodiment of the present invention, the protection layer is made of monocrystalline silicon.

In the OLED display device in accordance with the embodiment of the present invention, the first inorganic layer is made of one or a combination of at least two of silicon nitride, silicon dioxide, aluminum oxide, titanium dioxide, and zirconium dioxide.

In the OLED display device in accordance with the embodiment of the present invention, the second inorganic layer is made of a material same as that of the first inorganic layer.

In the OLED display device in accordance with the embodiment of the present invention, a portion of the encapsulation layer located at an inside of the barrier layer comprises the first inorganic layer, an organic layer, and the second inorganic layer.

In the OLED display device in accordance with the embodiment of the present invention, the organic layer has a thickness greater than that of the first inorganic layer, and the second inorganic layer has a thickness same as that of the first inorganic layer.

In the OLED display device in accordance with the embodiment of the present invention, the barrier layer has a thickness less than that of the organic layer, and the thickness of the barrier layer is greater than that of the first inorganic layer.

In the OLED display device in accordance with the embodiment of the present invention, the organic layer is formed on the first inorganic layer through an ink jet printing process.

In the OLED display device in accordance with the embodiment of the present invention, the ink jet printing process is performed with an organic ink consisting of acid ester organic matter, acid organic matter, and photopolymerization initiator.

The present invention has advantages as follows: the OLED display device of the present invention is added with the protection layer on encapsulation organic layer and the barrier layer to separate the organic layer at the inside of the barrier layer from the organic layer formed in excess of the barrier layer, thereby to effectively prevent the external moisture or oxygen from entering the OLED display device through an overflowing portion of the organic layer, and to reduce the risk that internal components of the OLED display device may oxidize, thereby further increasing a lifespan of the OLED display device.

DESCRIPTION OF PREFERRED EMBODIMENTS

Figure 1:
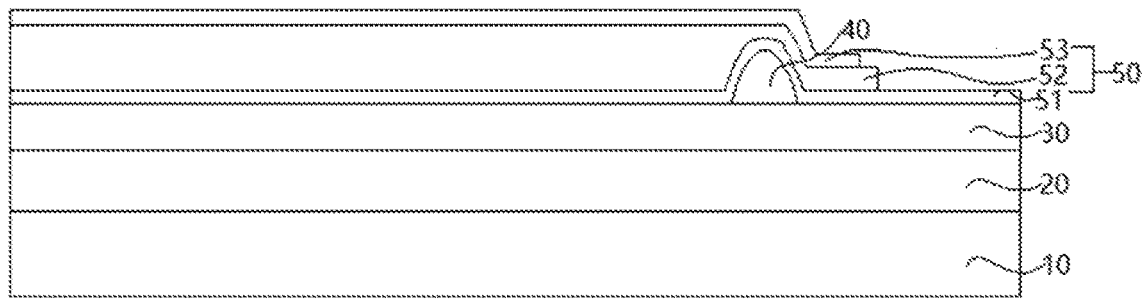
FIG. 1 is a schematic view showing a conventional organic light emitting diode (OLED) display device, wherein an encapsulation organic layer overextends.

The following embodiments are referring to the accompanying drawings for exemplifying specific implementable embodiments of the present disclosure. Furthermore, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, elements with similar structures are labeled with like reference numerals.

The present invention is directed to address drawbacks of current organic light emitting diode (OLED) devices that an amount of ink jet is too much causing an organic ink to be diffused over a barrier layer, and the organic ink at an inside and outside of the barrier layer to be interconnected, and thus an organic layer is formed in excess of coverage of an inorganic layer, further bringing about permeation of moisture or oxygen from the outside and resulting in ineffectiveness of the OLED display devices.

FIG. 1 is a schematic view showing a conventional OLED display device, wherein an encapsulation organic layer overextends. The conventional OLED display device has a flexible substrate 10, a thin-film transistor (TFT) layer 20 formed on the flexible substrate 10, an OLED light emitting layer 30 formed on the TFT layer 20, and a barrier layer 40 and an encapsulation layer 50 disposed on the TFT layer 20. The encapsulation layer 50 has a first inorganic layer 51, an organic layer 52, and a second inorganic layer 53 laminated with each other.

In preparing the encapsulation layer 50, due to sealing properties of the first inorganic layer 51 and the second inorganic layer 53, and stress-resistant properties of the organic layer 52, the barrier layer 40 is necessitated to limit a film forming range of the organic layer 52, so as to allow the second inorganic layer 53 to completely cover the organic layer 52, thereby preventing moisture or oxygen from entering the OLED display device through the organic layer 52 having poor blocking properties.

When the organic ink for preparing the organic layer 52 is applied too much or fast, the organic ink overflows the barrier layer 40. Due to surface tension, the organic ink at the inside and outside of the barrier layer 40 cohere, and therefore the organic layer 52 extends over coverage of the first inorganic layer 51, causing external moisture or oxygen to permeate through the organic 52, whereby rendering the OLED display device ineffective.

Figure 2:
FIG. 2 is a schematic structure view of an organic light emitting diode (OLED) display device of the present invention.

FIG. 2 is a schematic structure view of an OLED display device of the present invention. The OLED display device of the present invention includes a flexible substrate 10, a TFT layer 20 disposed on the flexible substrate 10, an OLED light emitting layer 30 disposed on the TFT layer 20, and a barrier layer 40 and an encapsulation layer 50 disposed on the TFT layer 20.

The encapsulation layer 50 covers the barrier layer 40. A portion of the encapsulation layer 50 located at an outside of the barrier layer 40 includes a first inorganic layer 51 and a second inorganic layer 53. A protection layer 60 is disposed on a portion of the first inorganic layer 51 over a surface of the barrier layer 40, and the protection layer 60 completely covers the barrier layer 40. A portion of the encapsulation layer 50 located at an inside of the barrier layer 40 includes the first inorganic layer 51, an organic layer 52, and the second inorganic layer 53.

A method of manufacturing the OLED display device of the present invention is stated below.

First, provide a clean glass substrate, forming the flexible substrate 10 on a surface of the glass substrate. The flexible substrate 10 is made of polyimide, and is a wear-resistant transparent plastic film. Then, form, by utilizing a photolithography process, the TFT layer 20 on the flexible substrate 10, and the TFT layer 20 is an inorganic layer. Next, form, by utilizing vacuum evaporation, the OLED light emitting layer 30 on the TFT layer 20. The OLED light emitting layer 30 includes a blue sub-pixel light emitting layer, a green sub-pixel light emitting layer, and a red sub-pixel light emitting layer. Next, form the barrier layer 40 on a surface of the TFT layer 20.

Next, form the first inorganic layer 51 on the OLED light emitting layer 30, wherein the first inorganic layer 51 covers the barrier layer 40. The first inorganic layer 51 is made of one or a combination of at least two of silicon nitride, silicon dioxide, aluminum oxide, titanium dioxide, and zirconium dioxide. The first inorganic layer 51 is a hydrophilic film and preferably has a thickness of 0.1-2 micrometers, for example, 1 micrometer. The first inorganic layer 51 is preferably made by a plasma enhanced chemical vapor deposition method or an atomic layer deposition method, wherein the plasma enhanced chemical vapor deposition method is used for ionizing gas containing film composition atoms by means of microwave or radio frequency to form plasma at partial portions. Plasma chemical activity is strong and thus is easy to react, so that a desired film can be deposited on a substrate. The atomic layer deposition method is a method for plating a substance on a surface of the substrate with a single atomic film laminated one by one.

After the first inorganic layer 51 is deposited on the surface of the OLED light emitting layer 30, the protection layer 60 is then disposed on a portion of the first inorganic layer 51 over a surface of the barrier layer 40, and the protection layer 60 completely covers the barrier layer 40. The protection layer 60 has a hydrophobicity greater than a hydrophobicity of the first inorganic layer 51, and the protection layer 60 is made of monocrystalline silicon.

The organic layer 52 is deposited on the surface of the first inorganic layer 51. A side wall of the organic layer 52 located at a junction of a display area and a non-display area is blocked by the barrier layer 40. The barrier layer 40 limits an extended area of the organic layer 52.

The organic layer 52 is formed on the first inorganic layer 51 through an ink jet printing process. The ink jet printing process is performed with an organic ink consisting of acid ester organic matter, acid organic matter, and photopolymerization initiator. The organic layer 52 has a thickness greater than that of the first inorganic layer 51, preferably is 1-10 micrometers, and, for example, is five micrometers.

The barrier layer 40 has a thickness less than that of the organic layer 52, and the thickness of the barrier layer 40 is greater than that of the first inorganic layer 51. The thickness of the barrier layer 40 preferably is three micrometers.

After the organic layer 52 is deposited on the first inorganic layer 51, the second inorganic layer 53 is deposited on the organic layer 52. A portion of the second inorganic layer 53 is located over the barrier layer 40 and covers the protection layer 60.

The second inorganic layer 53 is made of a material same as that of the first inorganic layer 51, and has a thickness same as the thickness of the first inorganic layer 51. The thickness of the second inorganic layer 53 preferably is 0.1-2 micrometers, and, for example, is one micrometer, and the second inorganic layer 53 is made by the plasma enhanced chemical vapor deposition method or the atomic layer deposition method. A portion of the second inorganic layer 53 located at an inside of the barrier layer 40 directly covers the organic layer 52. A portion of the second inorganic layer 53 located at an outside of the barrier layer 40 covers the protection layer 60 and the first inorganic layer 51, wherein the second inorganic layer 53 is directly connected with the first inorganic layer 51 at a surrounding area, such that the organic layer 52 is sealed by the first and second inorganic layers 51 and 53, thereby to prevent moisture or oxygen from entering the organic layer 52 from the surrounding area.

The present invention utilizes the protection layer 60 disposed over the barrier layer 40 to prevent external moisture or oxygen from entering the OLED display device through an overflowing portion of the organic layer 52. Because of the hydrophobicity of the protection layer 60, when the organic ink is diffused to overflow the barrier layer 40, the protection layer 60 is utilized to enable the portions of the organic ink at the inside and outside of the barrier layer 40 to cohere, respectively, whereby they are disconnected from each other. At the same time, due to the great hydrophobicity, the protection layer 60 itself is not likely to function as a channel for the moisture or oxygen erosion.

The present invention has advantages as follows: the OLED display device of the present invention is added with the protection layer on encapsulation organic layer and the barrier layer to separate the organic layer at the inside of the barrier layer from the organic layer formed beyond the barrier layer, thereby to effectively prevent the external moisture or oxygen from entering the OLED display device through an overflowing portion of the organic layer, and to reduce the risk that internal components of the OLED display device may oxidize, thereby further increasing a lifespan of the OLED display device.

It is understood that the invention may be embodied in other forms within the scope of the claims Thus the present examples and embodiments are to be considered in all respects as illustrative, and not restrictive, of the invention defined by the claims.

What is claimed is:

1. An organic light emitting diode (OLED) display device, comprising:
    a flexible substrate;
    a thin-film transistor (TFT) layer disposed on the flexible substrate;
    an OLED light emitting layer disposed on the TFT layer;
    a barrier layer disposed on the TFT layer; and
    an encapsulation layer covering the barrier layer, and a portion of the encapsulation layer located at an outside of the barrier layer comprising a first inorganic layer and a second inorganic layer;
    wherein a protection layer is disposed on a portion of the first inorganic layer over a surface of the barrier layer, the protection layer completely covers the barrier layer, and the protection layer has a hydrophobicity greater than a hydrophobicity of the first inorganic layer.

2. The OLED display device of claim 1, wherein the protection layer is made of monocrystalline silicon.

3. The OLED display device of claim 1, wherein the first inorganic layer is made of one or a combination of at least two of silicon nitride, silicon dioxide, aluminum oxide, titanium dioxide, and zirconium dioxide.

4. The OLED display device of claim 3, wherein the second inorganic layer is made of a same material as that of the first inorganic layer.

5. The OLED display device of claim 1, wherein a portion of the encapsulation layer located at an inside of the barrier layer comprises the first inorganic layer, an organic layer, and the second inorganic layer.

6. The OLED display device of claim 5, wherein the organic layer has a thickness greater than that of the first inorganic layer, and the second inorganic layer has a same thickness as that of the first inorganic layer.

7. The OLED display device of claim 5, wherein the barrier layer has a thickness less than that of the organic layer, and the thickness of the barrier layer is greater than that of the first inorganic layer.

8. The OLED display device of claim 5, wherein the organic layer is formed on the first inorganic layer through an ink jet printing process.

9. The OLED display device of claim 8, wherein the ink jet printing process is performed with an organic ink consisting of acid ester organic matter, acid organic matter, and photopolymerization initiator.

10. An organic light emitting diode (OLED) display device, comprising:
 a flexible substrate;
 a thin-film transistor (TFT) layer disposed on the flexible substrate;
 an OLED light emitting layer disposed on the TFT layer;
 a barrier layer disposed on the TFT layer; and
 an encapsulation layer covering the barrier layer, and a portion of the encapsulation layer located at an outside of the barrier layer comprising a first inorganic layer and a second inorganic layer;
 wherein a protection layer is disposed on a portion of the first inorganic layer over a surface of the barrier layer, and the protection layer completely covers the barrier layer;
 wherein the protection layer is made of monocrystalline silicon.

11. The OLED display device of claim 10, wherein the first inorganic layer is made of one or a combination of at least two of silicon nitride, silicon dioxide, aluminum oxide, titanium dioxide, and zirconium dioxide.

12. The OLED display device of claim 11, wherein the second inorganic layer is made of a same material as that of the first inorganic layer.

13. An organic light emitting diode (OLED) display device, comprising:
 a flexible substrate;
 a thin-film transistor (TFT) layer disposed on the flexible substrate;
 an OLED light emitting layer disposed on the TFT layer;
 a barrier layer disposed on the TFT layer; and
 an encapsulation layer covering the barrier layer, and a portion of the encapsulation layer located at an outside of the barrier layer comprising a first inorganic layer and a second inorganic layer;
 wherein a portion of the encapsulation layer located at an inside of the barrier layer comprises the first inorganic layer, an organic layer, and the second inorganic layer, and the organic layer is formed on the first inorganic layer through an ink jet printing process;
 wherein a protection layer is disposed on a portion of the first inorganic layer over a surface of the barrier layer and completely covers the barrier layer, wherein the ink jet printing process is performed with an organic ink consisting of acid ester organic matter, acid organic matter, and photopolymerization initiator.

* * * * *